United States Patent [19]

Main

[11] 4,385,364
[45] May 24, 1983

[54] ELECTRONIC GAIN CONTROL CIRCUIT

[75] Inventor: W. Eric Main, Mesa, Ariz.

[73] Assignee: Motorola, Inc., Schaumburg, Ill.

[21] Appl. No.: 203,013

[22] Filed: Nov. 3, 1980

[51] Int. Cl.³ .................... G06G 7/12; G06G 7/16
[52] U.S. Cl. .................... 364/857; 307/492; 307/493; 330/257; 330/263; 364/841
[58] Field of Search ........... 364/841, 857; 307/492, 307/493, 369; 330/254, 257, 263, 268

[56] References Cited

U.S. PATENT DOCUMENTS

| | | | |
|---|---|---|---|
| 3,838,262 | 9/1974 | van de Plassche | 364/841 |
| 3,940,603 | 2/1976 | Smith | 364/857 X |
| 4,004,141 | 1/1977 | Curtis | 364/841 |
| 4,038,566 | 7/1977 | Evans | 364/857 X |
| 4,065,725 | 12/1977 | Lillis et al. | 330/254 |
| 4,139,824 | 2/1979 | Ohsawa | 330/254 |
| 4,146,845 | 3/1979 | Lunquist | 330/268 X |
| 4,225,794 | 9/1980 | Buff | 307/493 |
| 4,234,804 | 11/1980 | Bergstrom | 307/493 |
| 4,316,107 | 2/1982 | Talbot | 307/492 |

Primary Examiner—Felix D. Gruber
Attorney, Agent, or Firm—Michael D. Bingham

[57] ABSTRACT

An electronic gain control circuit comprising a logarithmic circuit portion and an antilogarithmic circuit portion which is coupled to a current mirror circuit producing an output signal which is linearly related to an input signal applied to the logarithmic circuit portion thereof having a magnitude which is varied in response to a gain-control signal applied to the circuit. The logarithmic circuit portion of the gain control circuit provides a logarithmic voltage drive signal which drives the antilogarithmic circuit portion to supply an input current at the input of the current mirror having no fundamental signal components of the applied input signal. The output of the antilogarithmic circuit portion is coupled at an interconnect node with the output of the current mirror such that direct current components as well as second harmonic signal components of the applied input signal are cancelled and do not appear in the output of the electronic gain control circuit.

14 Claims, 7 Drawing Figures

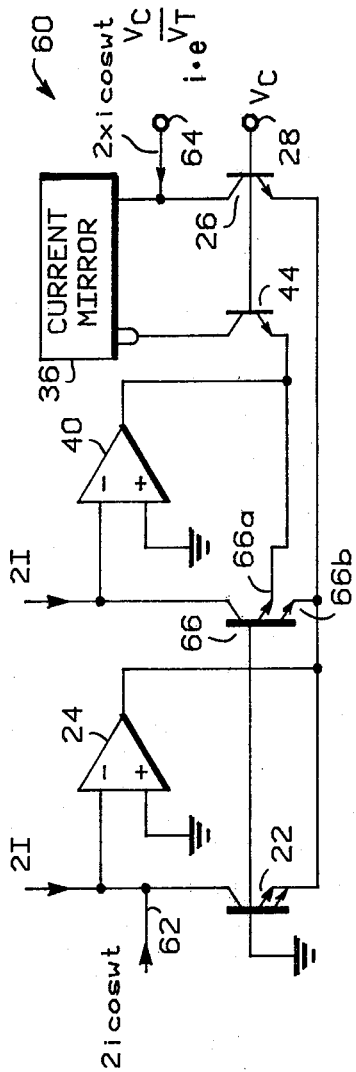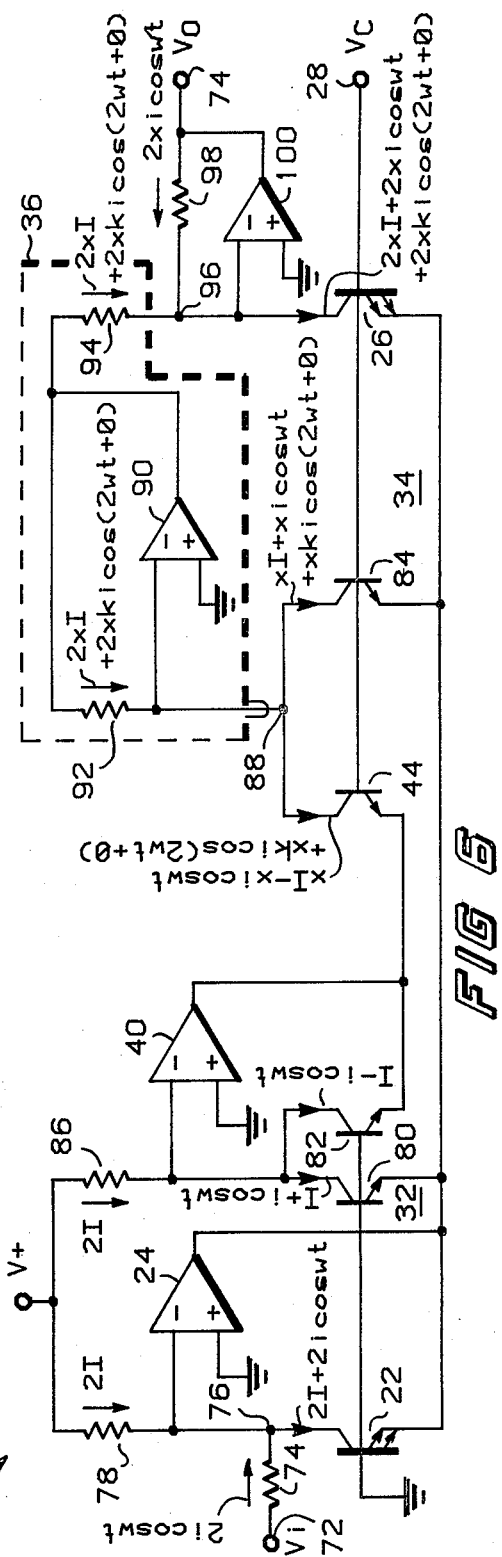
FIG 5
FIG 6

ELECTRONIC GAIN CONTROL CIRCUIT

BACKGROUND OF THE INVENTION

1. Field of the Invention

The present invention relates to gain controllable electronic circuits and more particularly to a log-antilog gain control circuit wherein the output signal produced therefrom contains substantially no direct current component or second harmonic signal component of the fundamental frequency of the input signal.

2. Description of the Prior Art

Monolithic variable transconductance and four quadrant multiplier circuits find common use as gain control circuits. For instance, U.S. Pat. No. 3,689,752 and an article written by Walter G. Jung, "Get Gain Control of 80 to 100 dB" electronic Design 13, 21 June 74, describe such multiplier circuits. These circuits provide good gain control but may suffer from non-linearity problems if the differential transistor pairs comprising the same are not perfectly matched with respect to each other. The non-linearity problem arises from the offset voltage mismatch between the differential transistor pairs as is understood. Hence, the output signal is not an exact reproduction of the input signal.

The prior art also includes log-antilog transfer function circuits, utilizing emitter-coupled transistors, for gain control. The output collector current of the output transistor of the two emitter coupled devices is linearly related to the collector current of the input transistor device hereof with the base-collector junction being zero biased. However, prior art log-antilog circuits, although not suffering from offset induced distortion as previously described, produce second harmonic signal components of the input current in the output collector current due to the bulk resistance of the base-emitter of the output transistor. This bulk resistance caused distortion makes the transistors imperfect logarithmic devices as is generally understood. Hence, if prior art log-antilog transfer function circuits are utilized as gain control stages in audio reproduction systems, serious intermodulation problems could arise therein due to the second harmonic signal component that is generated from the fundamental audio input signal.

Therefore, a need arises for a good gain control circuit suitable for manufacture in monolithic form to overcome the problems of variable transconductance multipliers and log-antilog circuits commonly used today and which can be utilized, for an example, in high fidelity audio sound systems.

SUMMARY OF THE INVENTION

Accordingly, it is an object of the present invention to provide an improved electronic gain control circuit.

It is another object of the present invention to provide an improved log-antilog gain control circuit.

A further object of the present invention is to provide a monolithic gain control circuit having a log-antilog transfer function such that the gain controlled output signal has no second harmonic signal components of an applied input signal.

A still further object of the present invention is to provide a log-antilog gain control circuit wherein the output signal therefrom contains no direct current or second harmonic signal components of an applied input signal.

In accordance with the above and other objects there is provided an electronic gain control circuit comprising a logarithmic circuit portion, an antilogarithmic circuit portion and a current mirror circuit. In response to applied input signals the logarithmic circuit produces a plurality of logarithmic output drive signals to the antilogarithmic circuit which in turn produces output signals that are linearly related to the input signals. The magnitudes of these signals are varied in accordance with a gain control signal that is applied to the antilogarithmic circuit. The current mirror sums first and second output signals of the antilogarithmic circuit such that an output signal is supplied and an output of the gain control current having substantially no direct current or second harmonic signal components of the input signal supplied to the input of said logarithmic circuit means.

BRIEF DESCRIPTION OF THE DRAWINGS

FIG. 5 is a partial schematic and block diagram of an electronic gain control circuit of another embodiment of the present invention;

FIG. 6 is a partial schematic and block diagram of an electronic gain control circuit of the preferred embodiment of the present invention.

DESCRIPTION OF THE PREFERRED EMBODIMENTS

Figure 1:
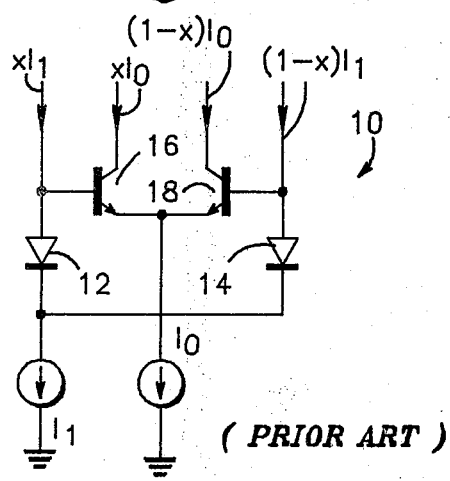
FIG. 1 is a schematic diagram of a known variable transconductance multiplier circuit.

Turning to FIG. 1, there is shown a differential gain control amplifier 10 generally known in the art which utilizes the logarithmic characteristics of diodes 12 and 14 in conjunction with the differentially connected transistors 16 and 18 to provide an output current at either one of the collectors of transistors 16 and 18 which is linearly related to the current flowing in diodes 12 and 14. Amplifier 10 is fully discussed in the aforereferenced U.S. Pat. No. 3,689,752 as well as U.S. Pat. No. 3,962,650. The gain of amplifier 10 is controlled by varying the conductivity of diodes 12 and 14 which gives a fairly linear variable output signal as understood. The problem with the circuit of FIG. 1 is that to have perfect linearity, i.e. no distortion between the input and output signal, diode 12 and transistor 16 as well as diode 14 and transistor 18 must be perfectly matched such that voltage offsets therebetween are not significant. However, if the voltage mismatch between the two differential pairs of devices is not substantially zero there occurs a nonlinearity due to this offset voltage. For example, a 500 micro volt mismatch between the offsets of the pairs will cause a one percent (at full scale) non-linearity at the output thereof.

Figure 2:
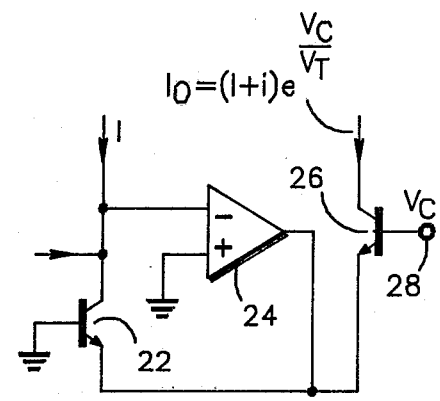
FIG. 2 is a schematic diagram of a log-antilog circuit according to the present invention.

Turning to FIG. 2 there is shown a log-antilog gain control circuit 20 which is utilized in the present invention for producing an output signal which is linearly related to an applied input signal and having a magnitude which is varied in response to a gain control signal applied thereto. As illustrated, log-antilog gain control circuit 20 comprises a logarithmic output drive voltage producing circuit portion including transistor 22 and operational amplifier 24 and an antilog circuit portion comprising transistor 26 which receives the gain control voltage, $V_C$ that is supplied at terminal 28 to the base thereof. Transistor 22 is adapted to receive both an alternating current input signal, i, and a direct current, I. The collector of transistor 22 is coupled to the inverting input of operational amplifier 24 the output of which is coupled to the emitter thereof such that with the noninverting input of the op amp 24 being returned to earth or ground potential, the collector of transistor 22 is biased at virtual ground potential. The base of transistor 22 is directly returned to ground potential with the emitter of this transistor being coupled to drive the emitter electrode of transistor 26. Hence, with the base and collector of transistor 22 being at ground potential the collector-base junction is zero biased. Op amp 24 provides two basic functions. First, it ensures that the collector-to-base junction of transistor 22 is zero biased. Secondly, op amp 24 provides feedback to the emitter of transistor 22 to cause the collector current of transistor 22 to be substantially equal to the sum of the two currents summed at the collector thereof. Hence, with the collector-base junction of transistor 22 being zero biased the base to emitter junction of this transistor produces a logarithmic drive voltage thereacross which conforms to the well known diode equations:

$$I = I_s e^{(V_{be}/KT/q)}; \text{ and} \quad (1)$$

$$V_{be} = KT/q \ln I/I_s \quad (2)$$

where:
 $V_{be}$ is the base-emitter voltage of the transistor;
 I is the collector current of the transistor; and
 $I_s$ is the reverse leakage current of the transistor.
 K is Boltzmann's constant
 T is temperature Thus, the linear input currents, $i + I$, produce a logarithmic voltage drive signal at the emitter of transistor 22 which drives the emitter of transistor 26. The logarithmic voltage drive signal, in conjunction with the gain control signal, VC, is converted to a linear collector current at the collector of transistor 26 which is equal to:

$$I_o = (i + I)e^{VC/VT} \quad (3)$$

where:
 $VT = KT/q$

Therefore, the output signal appearing at the collector of transistor 26 is linearly related to the input current supplied at the collector of transistor 22 multiplied by a gain factor x:

$$\text{where } x = e^{VC/VT} \quad (4)$$

Although log-antilog circuit 20 produces a gain controlled output signal linearly related to an applied input signal and does not suffer from offset distortion problems as described above in reference to FIG. 1, log-antilog circuit 20 does have distortion problems that do not make it ideal for use in high fidelity audio reproduction systems. The most significant distortion generated by log-antilog circuit 20 is caused by transistors 22 and 26 being imperfect logarithmic devices due to the bulk resistance of the base-emitter junctions thereof. This phenomena causes second and higher order harmonics of the fundamental frequency of the input signal, i, to be present in the output current $I_o$. The most predominant distortion is caused by the second harmonic signal component which can cause serious intermodulation distortion in high fidelity audio reproduction systems. Additionally, the direct current component of the collector current of transistor 22 also appears in the output current of the collector of transistor 26 which is not desirous. For instance, as the gain of log-antilog amplifier circuit 20 is varied, the dc quiescent operating point of the circuit is also changed which can induce nonlinearities in the output as well as cause saturation in later amplifier stages which may be coupled to the output of log-antilog amplifier circuit 20.

Figure 3:
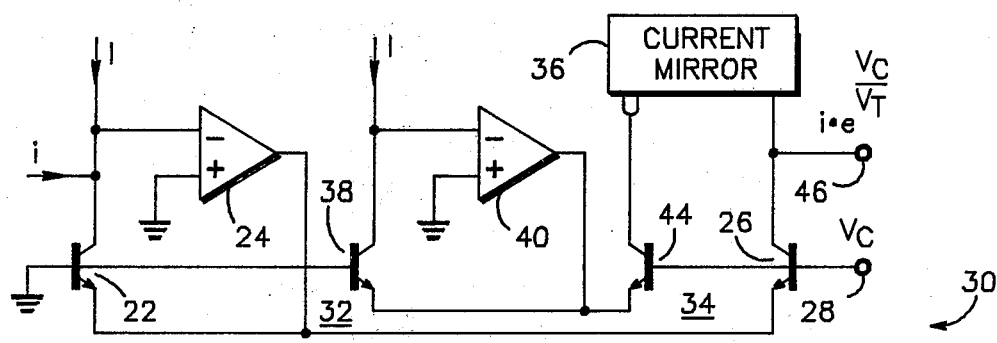
FIG. 3 is a partial schematic and block diagram illustrating an electronic gain control circuit of one embodiment of the present invention.

Referring to FIG. 3 there is illustrated electronic gain control circuit 30 which comprises log-antilog amplifier circuit 20. It should be noted that components in remaining FIGS. 3-7 corresponding to like components in FIG. 2 are referenced using the same reference numerals. Generally, gain control circuit 30 can be described as comprising a logarithmic voltage drive circuit portion 32 for driving anti-logarithmic signal circuit portion 34 and current mirror circuit 36. As illustrated, logarithmic voltage drive signal circuit portion 32 includes log-antilog amplifier circuit 20 adapted to receive the alternating and dc current input signals at the collector of transistor 22 to produce a first logarithmic voltage drive signal at the emitter thereof for driving the emitter of transistor 26 as previously discussed. In addition, circuit portion 32 also includes a second log voltage drive stage including transistor 38 and operational amplifier 40 connected in the same manner as log-antilog circuit 20. However, the logarithmic voltage drive signal appearing at the emitter of transistor 38 has no signal component of the input signal, i, and is utilized to drive the emitter of transistor 44.

In operation, transistor 44 transforms the logarithmic voltage signal at the emitter thereof to a linear current appearing in the collector thereof as described above. The magnitude of collector current of transistor 44 is equal to:

$$I_{44} = xI \quad (5)$$

where x is the aforementioned gain factor.

Thus, the collector of transistor 44 supplies the input current of current mirror 36 (the input being represented by the small half circle) such that at the output thereof which is connected to the collector of transistor 26, there appears a current of equal value to the current in the collector of transistor 44, $I_{44}$. The direct current component, xI, at the output of current mirror 36 is then subtracted at the collector of transistor 26 since the collector current is a function xI of the dc signal supplied to transistor 22 that is equal to that supplied to transistor 38 such that the output current signal at output 46 is linearly related to the input signal multiplied by the gain factor x as described previously with respect to FIG. 2. Thus, electronic gain control circuit 30 provides cancellation of the direct current component that would otherwise appear in the output signal at output 46. However, the output signal from electronic gain control circuit 30 does contain second and higher order harmonics of the fundamental frequency of input current, i.

Figure 4:
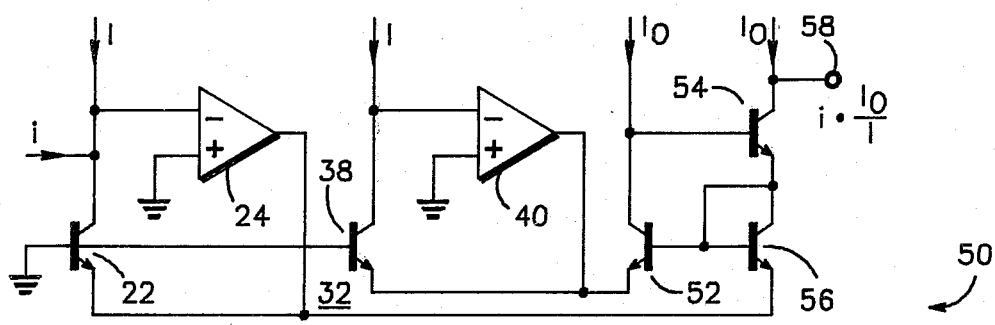
FIG. 4 is a partial schematic and block diagram illustrating an electronic gain control circuit of a second embodiment of the present invention.

FIG. 4 illustrates another manner of providing gain control using log-antilog amplifier circuit 20 to derive an output signal linearly related to an input signal and having no direct current components therein. Electronic gain control circuit 50 includes the logarithmic voltage circuit 32 as described with reference to FIG. 3 with the outputs of transistors 22 and 38 being coupled to a modified form of a "Wilson" current mirror circuit comprising transistors 52, 54 and 56. Hence, in response to the applied input signal current, i, and current I, a logarithmic drive voltage signal is supplied to the emitter of transistor 56. Antilog transistor 56 produces a linear collector current which also appears in the collector of transistor 52 which is coupled in cascode with the former. Because of feedback occurring from the emitter of transistor 54 to the base of transistor 52, the collector current of this transistor is made to remain constant such that at output terminal 58 which is connected to the collector of transistor 54 there appears the input current, i, multiplied by the gain factor which is equal to the ratio of the DC currents currents $I_o$ and I. Hence, the output current at output 58 as shown by the equation in FIG. 4 does not comprise any direct current components but does however contain second and higher order harmonics of the fundamental frequency of the input current due to the well known bulk resistance effect of transistor 56.

In FIG. 5, there is illustrated electronic gain control circuit 60 for producing a linear gain controlled output current signal having neither direct current signal components or second harmonic frequency signal components of the fundamental frequency of the applied input signal. Transistor 22 produces a logarithmic voltage drive signal at the emitter thereof as previously described which is utilized to drive the emitter 66b of transistor 66 as well as transistor 26. The logarithmic voltage drive signal at emitter 66b produces an antilogarithmic current at the collector of transistor 66 which then produces a logarithmic drive voltage at the emitter 66a. Because the collector current of multi-emitter transistor 66 must be equal to the constant direct current component 2I, the logarithmic voltage drive signal appearing at the emitter 66a of transistor 66 has a DC component (I); an antiphased but equal component of the fundamental frequency of the input signal, i, appearing at the emitters of transistor 22; and a second harmonic signal component of the fundamental frequency. Hence, the linear current appearing at the collector of anti-logarithmic transistor 44 comprises the following components:

$$I - ix \cos \omega t + ixk \cos (2\omega t + \phi) \quad (6)$$

where:
input signal i is now shown as equal to $i \cos \omega t$;
x is the aforementioned gain factor; and
k is an additional multiplier factor resulting to higher order harmonics. The collector of transistor 44 being connected to the input of current mirror 36 produces a current at the output thereof of equal magnitude and composition as the collector current of transistor 44. The output of current mirror 36 being connected to the collector of transistor 26; the direct current component as well as the second harmonic component of the input signal supplied at input 62 is subtracted at the collector of transistor 26 such that the output current appearing at output 64, $I_{64}$, is equal to:

$$I_{64} = 2ix \cos \omega t \quad (7)$$

Hence, the output signal appearing at output 64 is equal to the input current supplied at input terminal 62 multiplied by the gain factor x and does not contain any DC or second harmonic signal components of the input signal. However, the fundamental frequency of the input signal component does appear in current mirror 36.

Gain control circuit 70 illustrated in FIG. 6 functions in a manner substantially identical to that of gain control circuit 60 but eliminates fundamental components of the input signal from appearing in current mirror circuit 36. Thus, in response to input voltage Vi applied to input 72, an output voltage V0 is produced at output terminal 74 which is linearly related thereto. As shown, the input voltage Vi is converted to a current through resistor 74 and is then summed at node 76 with direct current, 2I, supplied via resistor 78. Transistor 22, which may be a multi-emitter device, has its collector-base zero biased by operational amplifier 24 to produce a logarithmic drive voltage at the emitter(s) thereof which is a function of the collector current of transistor 22. The logarithmic drive voltage at the emitters of transistor 22 drives anti-logarithmic transistors 84 and 26. This drive voltage also is supplied to antilog transistor 80 which in turn drives logarithmic transistor 82. Transistor 80 corresponds to emitter 66b and transistor 82 to emitter 66a of transistor 66 shown in FIG. 5. Resistor 86 being coupled to resistor 78 and being of equal value therewith provides a direct current component, 2I to the collectors of transistors 80 and 82 respectively. In order that the collector currents of these two transistors sum to the value of the direct current component through resistor 86, the collector currents of transistors 80 and 82 each have equal components of the fundamental input current which are in antiphase relationship with respect to one another as is illustrated. The collector current of transistor 82 produces a logarithmic drive voltage at the emitter thereof for driving transistor 44 such that the linear current at the collector of the latter has components of the direct current signal component, the antiphase fundamental signal component and (due to bulk resistance effect) second harmonic signal components of the fundamental frequency of the input signal. Similarly, transistor 84, which is driven by the logarithmic voltage drive signal from transistor 22, produces a linear collector current having the same components therein as transistor 44 except that the fundamental signal component is in antiphase relationship to the fundamental signal component appearing in the collector current of transistor 44. The collector currents of transistors 44 and 84 are summed at node 88 to produce an input current at the input of current mirror 36 having no fundamental signal component.

Current mirror 36 is illustrated as comprising operational amplifier 90 with equal valued resistors 92 and 94 interconnected at one end thereof to the output of the op amp. The other end of resistor 92 is connected to the inverting input of op amp 90 which is the input of current mirror 36. The other end of resistor 94 is connected at node 96 to the inverting input of operational amplifier 100 which has its output returned via resistor 98 to node 96 and also connected to output 74. With the non-inverting inputs of op amps 90 and 100 held at ground reference potential the voltages developed across resistors 92 and 94 are substantially equal such that the currents flowing into nodes 88 and 96 are equal. Thus, as shown, the collector current appearing at transistor 26, generated in response to the logarithmic voltage drive signal appearing at the emitter(s) of transistor 22, has signal components that are equal in magnitude with the signal components comprising the output current of current mirror 36 plus a component of the fundamental input current signal multiplied by the value x. Hence, there appears between output terminal 74 and node 96, across resistor 98, the input fundamental current signal multiplied by the foregoing gain factor x.

It should be understood from the previous description that transistors 22 and 26 can be multi-emitter transistors or even a single emitter device having greater emitter area to sustain greater current density obtained by the use of multi-emitter transistors and circuit 70 will still function properly. Likewise transistors 80, and 82 or 44 and 84 could be utilized by a single collector, multi-emitter transistor in similar manner as shown by transistor 66 of FIG. 5.

Figure 7:
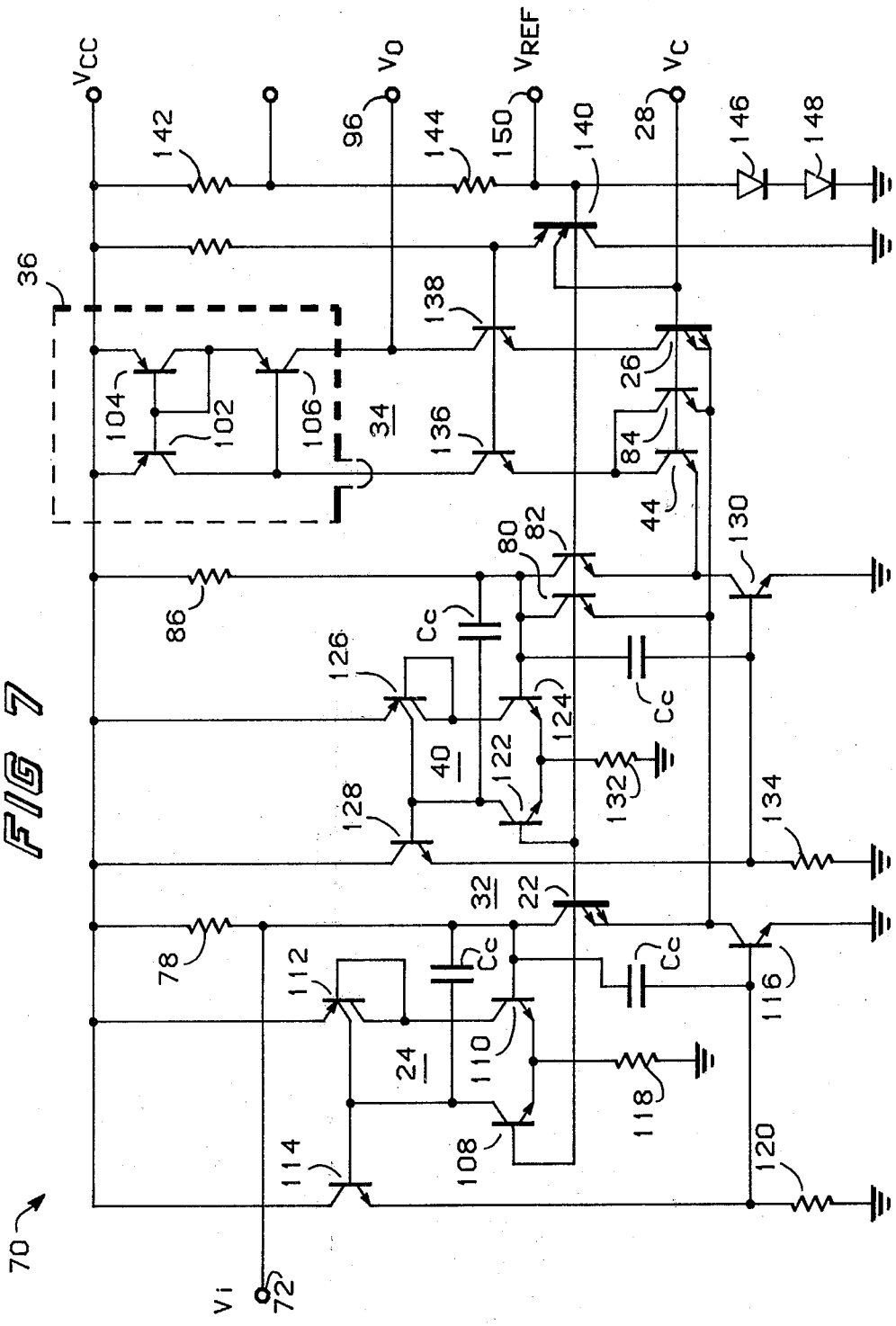
FIG. 7 is a complete schematic diagram illustrating the preferred embodiment of the present invention.

FIG. 7 illustrates, in detail, gain control circuit 70 of the preferred embodiment of the invention including logarithmic circuit portion 32, antilog circuit portion 34, and current mirror 36. In actual implementation, current mirror 36 is realized utilizing a PNP current mirror circuit comprising transistors 102, 104 and 106. Operational amplifier 24 is realized by transistors 108–116 and resistors 118 and 120 with the output of the op amp being the collector of transistor 116. Similarly, operational amplifier 40 comprises transistors 122–130 and resistors 132, 134 with the output thereof being taken at the collector of transistor 130. The capacitors, $C_C$, are compensation capacitors to prevent oscillation of the circuit from occurring as is generally understood. Transistors 136 and 138 which are connected in cascode between the input and output of current mirror 36 to the collectors of transistors 44, 84 and 26 respectively provide buffering to these transistors from voltage swings appearing at output terminal 96. Additionally, multi-emitter transistor 140 is used to level shift the voltage at the bases of transistors 136 and 138 up from Vref which ensures that the collector and base junction of transistor 26 is zero biased while preventing the former from becoming saturated. The magnitude of Vref is generated by the bias chain comprising resistors 142, 144 which are serially connected to the two diodes 146 and 148. Gain control voltage Vc is applied at terminal 28 directly to the base electrodes of transistors 44, 84 and 26 so that these several gain control transistors can be ganged together accurately.

Thus, what has been disclosed is a novel electronic gain control circuit comprising log-antilog circuit portions and a current mirror for producing an output signal that is linearly related to an applied input signal, the magnitude of the output signal is controlled by a gain control signal that is applied to the antilog circuit portion of the electronic gain control circuit.

I claim:
1. A gain control circuit comprising:
logarithmic circuit means responsive to applied input signals for producing logarithmic voltage drive signals;
antilogarithmic circuit means coupled to said logarithmic circuit means responsive to said logarithmic voltage drive signals and a gain control signal for producing first and second output signals;
circuit means for summing said first and second output signals at an output such than an output signal is produced which is linearly proportional to the applied input signals and having a magnitude which is varied in response to said gain control signal, said output signal comprising substantially no direct current signal components; and
said logarithmic circuit means including:
a. a first logarithmic circuit comprising a first transistor having first and second main electrodes and a control electrode, said control electrode being coupled to a first terminal at which is supplied a ground reference potential, said second main electrode being adapted to receive an AC input signal and a first DC signal, said first main electrode being coupled to said antilogarithmic circuit means, and first amplifier means having an input and an output, said input being coupled to said second main electrode of said first transistor and said output being coupled to said first main electrode thereof such that a virtual ground is provided at said second main electrode of said first transistor, said first logarithmic circuit producing a first logarithmic voltage drive signal to said antilogarithmic circuit means; and
b. a second logarithmic circuit comprising a second transistor having first and second main electrodes and a control electrode, said first main electrode being coupled to said antilogarithmic circuit means, said second main electrode receiving a second DC signal of substantially equal magnitude of said first DC signal, said control electrode being coupled to said first terminal, and second amplifier means having an input coupled to said second main electrode of said second transistor and an output coupled to said first main electrode of said second transistor such that a virtual ground is produced at said second main electrode, said second logarithmic circuit producing a second logarithmic voltage drive signal to said antilogarithmic circuit means.

2. The gain control circuit of claim 1 wherein said antilogarithmic circuit means includes:
a third transistor having first and second main electrodes and a control electrode, said first main electrode being coupled to said first main electrode of said second transistor, said second main electrode being coupled to said circuit means for summing output signals and said control electrode being coupled to a second terminal at which said gain control signal is supplied; and
a fourth transistor having first and second main electrodes and a control electrode, said first main electrode being coupled to said first main electrode of said first transistor, said second main electrode being coupled to said circuit means for summing output signals and said control electrode being coupled to said second terminal.

3. The gain control circuit of claim 2 wherein said circuit means for summing output signals being a current mirror having an input coupled to said second main electrode of said third transistor and an output coupled to said second main electrode of said fourth transistor.

4. A gain control circuit comprising:
logarithmic circuit means responsive to applied input signals for producing logarithmic voltage drive signals;
antilogarithmic circuit means coupled to said logarithmic circuit means responsive to said logarithmic voltage drive signals and a gain control signal for producing first and second output signals;
circuit means for summing said first and second output signals at an output such than an output signal is produced which is linearly proportional to the applied input signals and having a magnitude which is varied in response to said gain control signal, said output signal comprising substantially no direct current signal components; and said antilogarithmic circuit including:
- a. a first transistor having first, second main electrodes and a control electrode, said first electrode being coupled to said logarithmic circuit means, said second main electrode being coupled to an input of said circuit means for summing, said control electrode receiving said gain control signal; and
- b. a second transistor having first, second main electrodes and a control electrode, said first main electrode being coupled to said logarithmic circuit means, said second main electrode being coupled to an output of said circuit means for summing and said control electrode receiving said gain control signal.

5. The gain control circuit of claim 4 wherein said circuit means for summing being a current mirror circuit having an input coupled to said second main electrode of said first transistor and an output coupled to said second main electrode of said second transistor.

6. The gain control circuit of claim 5 wherein said logarithmic circuit means includes:
a third transistor having at least first and second main electrodes and a control electrode, said first electrode being coupled to said first main electrode of said second transistor, said second main electrode receiving an alternating input signal and a first direct current signal, said control electrode being coupled to a first terminal at which is supplied a ground reference potential; and
a first amplifier having first and second inputs, and an output, said first input being coupled to said second main electrode of said third transistor, said second input being coupled to said first terminal, said output being coupled to said first main electrode of said third transistor.

7. The gain control circuit of claim 6 wherein said logarithmic circuit means further includes:
a fourth transistor having first, second main electrodes and a control electrode, said first main electrode being coupled to said first main electrode of said first transistor, said second main electrode receiving a second direct current signal, said second direct current signal being substantially of equal magnitude of said first direct current signal, said control electrode being coupled to said first terminal; and
a second amplifier having first and second inputs and an output, said first input being coupled to said second main electrode of said fourth transistor, said second input being coupled to said first terminal and said output being coupled to said second main electrode of said fourth transistor.

8. The gain control circuit of claim 6 wherein said logarithmic circuit means further includes:
a fourth transistor having first, second main electrodes and a control electrode, said first main electrode being coupled to said first main electrode of said third transistor, said second main electrode being connected to a first node at which is supplied a second direct current signal the magnitude of which is substantially equal to said first direct current signal, said control electrode being coupled to said first terminal;
a fifth transistor having first, second main electrodes and a control electrode, said first main electrode being coupled to said first main electrode of said first transistor, said second main electrode being coupled to said first node and said control electrode being coupled to said first terminal; and
a second amplifier having first and second inputs and an output said first input being coupled to said first node, said second input being coupled to said first terminal, said output being coupled to said first main electrode of said fifth transistor.

9. The gain control circuit of claim 6 wherein said logarithmic circuit means further includes:
a fourth transistor having first, second and third main electrodes and a control electrode, said first main electrode being coupled to said first main electrode of said third transistor, said second main electrode being coupled to said first main electrode of said first transistor, said third main electrode receiving a second direct current signal substantially equal to said first direct current signal, said control electrode being coupled to said first terminal; and
a second amplifier having first and second inputs and an output, said first input being coupled to said third main electrode of said fourth transistor, said second input being coupled to said first terminal, said output being coupled to said second main electrode of said fourth transistor.

10. The gain control circuit of claim 8 or 9 wherein said antilogarithmic circuit means further includes:
a sixth transistor having first, second main electrodes and a control electrode, said first electrode being coupled to said first main electrode of said third transistor, said second main electrode being coupled to said second main electrode of said first transistor, said control electrode receiving said gain control signal; and
said second transistor having a third main electrode coupled with said first main electrode to said first main electrode of said third transistor.

11. The gain control circuit of claim 10 wherein:
said first and second amplifiers being operational amplifiers with said first and second inputs thereof being inverting and non-inverting inputs respectively;
said third transistor having a third main electrode coupled with said first main electrode thereof to said first and third main electrodes of said second transistor; and
said second and third transistors being multi-emitter bipolar transistors with said first and third main electrodes being said multi-emitters.

12. A gain control circuit for providing a gain controlled output signal that is linearly related to an applied input signal, comprising:
logarithmic circuit means responsive to the input signal and first direct current signals applied thereto for producing logarithmic voltage drive signals; and
current mirror means responsive to said logarithmic voltage drive signals for producing the output signal including,
a. a first transistor having first, second and control electrodes, said first electrode being coupled to a first output of said logarithmic circuit means, said second electrode receiving a second direct current signal;

b. diode means having a first and second electrode, said first electrode being coupled to a second output of said logarithmic circuit means and said second electrode being coupled to said control electrode of said first transistor; and c. a second transistor having first, second and control electrodes, said first electrode being coupled to said second electrode of said diode means, said second electrode receiving a third direct current signal and being coupled to an output of the gain control circuit, said control electrode being coupled to said second electrode of said first transistor such that the output signal is substantially equal to the ratio of said first direct current signal to said third direct current signal multiplied by the magnitude of the input signal.

13. The gain control circuit of claim 12 wherein said logarithmic circuit means includes:

a third transistor having first, second and control electrodes, said first electrode being coupled to said second output of said logarithmic circuit means, said second electrode receiving the input signal and a direct current signal, said control signal being coupled to a terminal at which is provided a ground reference signal; and first amplifier means having first, second inputs and an output, said first input being coupled to said second electrode of said third transistor, said second input being coupled to said terminal such that the potential appearing at said second electrode of said third transistor is substantially equal to said potential at said control electrode thereof, said output being coupled to said first electrode of said third transistor.

14. The gain control circuit of claim 13 wherein said logarithmic circuit means includes:

a fourth transistor having first, second and control electrodes, said first electrode being coupled to said first output of said logarithmic circuit means, said control electrode being coupled to said terminal, said second electrode receiving a direct current signal which is substantially equal to said direct current signal supplied to said third transistor;

second amplifier means having first and second inputs and an output, said first input being coupled to said second electrode of said fourth transistor, said second input being coupled to said terminal such that said second and control electrodes of said fourth transistor are maintained at substantially equal potentials, said output being coupled to said first electrode of said fourth transistor.

* * * * *